United States Patent [19] [11] 4,099,146
DeVries [45] Jul. 4, 1978

[54] ACOUSTIC WAVE STORAGE CONVOLVER

[75] Inventor: Adrian J. DeVries, Elmhurst, Ill.

[73] Assignee: Zenith Radio Corporation, Glenview, Ill.

[21] Appl. No.: 784,292

[22] Filed: Apr. 4, 1977

[51] Int. Cl.[2] .......................... H03H 9/26; H03H 9/30; G06G 7/19; H03H 9/02

[52] U.S. Cl. .................................. 333/30 R; 310/313; 333/70 T; 333/72; 364/821

[58] Field of Search ...................... 333/30 R, 72, 70 T; 364/821, 822, 824, 860, 861; 307/320; 358/167, 95; 310/313; 330/5.5, 4.9; 357/26

[56] References Cited

U.S. PATENT DOCUMENTS

| | | | |
|---|---|---|---|
| 3,975,696 | 8/1976 | Kantorowicz | 333/30 R |
| 4,021,657 | 5/1977 | Auld | 333/72 X |
| 4,037,174 | 7/1977 | Moore et al. | 364/821 X |
| 4,041,419 | 8/1977 | Desormiere et al. | 333/70 T X |

*Primary Examiner*—Alfred E. Smith
*Assistant Examiner*—Marvin Nussbaum
*Attorney, Agent, or Firm*—Nicholas A. Camasto

[57] ABSTRACT

An acoustic wave storage convolver includes a plurality of sampling transducers coupled to a surface wave propagating medium along a path defined by a pair of opposedly disposed input transducers. The sampling transducers, each of which is connected to a suitable signal storage element, are equally spaced along the path by an integral number of acoustic wavelengths plus or minus ¼ wavelength for providing successive samples of surface waves propagated along the medium in phase quadrature relationship. Means initiating the signal storage function and output means developing the convoluted product of two high frequency signals applied to the input transducers are provided.

10 Claims, 6 Drawing Figures

ACOUSTIC WAVE STORAGE CONVOLVER

BACKGROUND OF THE INVENTION

The present invention relates to acoustic wave devices and more particularly to acoustic wave storage devices for convolutely combining two high frequency signals.

Devices for performing the convolution or correlation operation on a pair of signals $f_1$ and $f_2$ are well known in the art. Such devices, typically referred to as convolvers or correlators, find application in various disciplines particularly in the communications field. For example, it is known that convolvers are the essential circuit elements in systems designed for removing the distortion produced by multipath transmission in communication channels. In television reception, multipath transmission effects are observably manifested by the production of replica images, i.e., "ghosts," displaced on the viewing screen of a television receiver from the main image. Apparatus contained within the television receiver for reducing the effect of such ghosts are known as ghost cancellation systems and normally include a convolver as the essential part thereof. In this regard, ghost cancellation is achieved by convolutely processing a reference signal transmitted during, for example, the vertical interval of the television signal, with the transmitted video signal to obtain a correction or synthetic ghost signal. The synthetic ghost signal is then suitably combined with the video signal to cancel the effect of ghosts therefrom.

It is well known in the prior art to employ various devices for the processing of two signals through the operation of convolution. U.S. Pat. No. 3,935,439 to Buss et al. discloses the use of charge transfer technology for this purpose.

Acoustic surface wave technology is another field in which the prior art workers have made extensive efforts to realize convolution arrangements. Such arrangements generally embody devices based on the non-linear parametric interaction of acoustic surface waves, see U.S. Pat. No. 3,794,939 to Waldner, or, alternatively, devices using semiconductor storage elements to facilitate the performance of the convolution operation on a pair of high frequency input signals previously transformed into surface waves. U.S. Pat. No. 3,975,696 to Kantorowicz typifies the prior art semiconductor storage type acoustic wave convolver.

Prior art acoustic wave storage convolvers are known in which a silicon substrate having a plurality of electrodes is brought into close proximity, for instance about 2,000 angstroms, to one surface of a surface wave propagating medium for providing a capacitive effect whereby charge is transferable to a large number of diodes fabricated on the silicon substrate. Charge is transferred to the diodes in response to the application of a read-in pulse applied across the air gap, this charge being modulated by propagating one of the signals to be convolved along the medium thereby storing this signal as changes in the capacitances of the storage diodes. The second signal to be convolved is subsequently propagated along the medium in a direction opposite of the first signal and interacts with the storage diodes to produce an output representing the convolution of the first and second signals.

Some of the problems associated with the fabrication and maintenance of the aforementioned uniform narrow air-gap, which makes possible uniform interaction between the silicon substrate and the surface wave propagating medium, are avoided by forming electrodes directly on the surface of the medium as taught in the previously mentioned Kantorowicz patent. However, other problems indigenous to known surface wave storage convolvers, e.g., the diode density per acoustic wave length and distortion producing coherent reflections from sampling elements, represent design constraints still imposing various undesirable restrictions on the use of such devices.

Conventionally, it has been considered necessary to use several diodes, usually at least three, per cycle or acoustic wavelength of the propagating signal in order to store a faithful representation of the signal. Due to the packaging density normally required to accommodate even three diodes per acoustic wavelength, the prior art has generally been limited to the use of integrated diode structures such as those fabricated on a semiconductor substrate as previously described. It would be desirable to improve on the prior art surface wave storage convolver in this respect by reducing to a minimum the number of diodes used to store a signal propagated along the surface of such a device. Among other factors, including reasons of economy, a reduction in diode density sufficient to enable the use of discrete diodes which could be selected for use in accordance with some predetermined criteria would significantly increase the flexibility of surface wave storage convolvers. In addition to the preselection facility, the discrete diodes could be individually matched and also replaced and/or repaired as necessary.

SUMMARY OF THE INVENTION

It is in general an object of the present invention to provide a novel acoustic wave storage convolver.

Another object of the invention is to provide an acoustic wave storage convolver having a reduced number of signal storage elements per acoustic wavelength of a signal propagated therealong.

A further object of the invention is to provide an acoustic wave storage convolver capable of storing a faithful representation of a signal propagated therealong on a series of discrete signal storage elements which may be preselected for providing optimum system performance.

Briefly, these objectives are realized in accordance with the present invention in an acoustic wave storage convolver by strategically locating a plurality of sampling transducers along the path of wave propagation on the surface of the convolver. The wave propagation path is defined by a pair of input transducers disposed for launching surface waves in opposite directions therebetween, each used for one of the input signals to be convolved. The launched surface waves are characterized by an acoustic wavelength $d_0$ related to the frequency $f_0$ of the input signals by the characteristic propagation velocity $v_0$ of the convolver. The locating strategy consists of spacing the sampling transducers, each of which is connected to a signal storage element, along the wave propagation path at intervals separated by an integral number of acoustic wavelengths plus or minus ¼ wavelength for deriving successive samples, in phase quadrature relationship, of surface waves propagating along the path. Means connected between the storage elements and a common electrode of the convolver are provided for enabling surface waves initially launched by one input transducer to be entered into storage and for convolutely combining therewith surface waves subsequently launched by the outer input transducer. The signals applied to the input transducers may comprise an rf carrier modulated by a baseband signal having a nominal bandwidth. In that case, the spatial sampling frequency defined by the spacing of the sampling transducers (i.e., the reciprocal of the center-to-center spacing of transducers) is preferably greater than or equal to about four times the nominal bandwidth of the baseband signal. In order to achieve the locating strategy discussed above the frequency of the rf modulating signal will normally be greater than this spatial sampling frequency.

System performance is further optimized by selecting components such that the operating capacitance exhibited by the individual storage elements is approximately one third the interelectrode capacitance of the individual sampling transducers as well as approximately equal to the capacitance formed by the individual sampling transducers in association with the common electrode.

DESCRIPTION OF THE PREFERRED EMBODIMENTS

Figure 1:
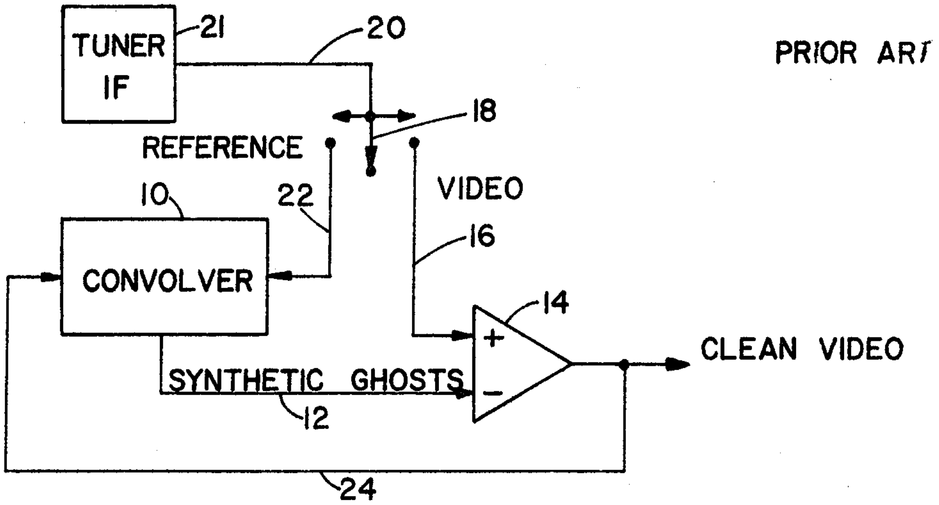
FIG. 1 illustrates in block diagram form a prior art ghost cancellation system using convolving apparatus.

As previously mentioned herein, various apparatus for performing the convolution operation on two signals are well known in the art and find particular utility in circuits designed for removing distortion resulting from multipath transmission in communication channels. One such circuit is shown in FIG. 1 wherein a convolver 10 comprises the essential component in a ghost cancellation system of the type suitable for use in a television receiver. Convolver 10 includes an output 12 on which is developed a synthetic ghost signal for application to one input of a difference amplifier 14. The other input of difference amplifier 14 is fed by a line 16 which is selectively connectable by a switch 18 to, for example, the tuner-IF section 21 of a television receiver for receiving video information from a line 20. Switch 18 is also operable for connecting line 20 to one input of convolver 10 through a line 22, the other input to convolver 10 being supplied over a line 24 coupled to the output of difference amplifier 14.

In operation, a reference signal transmitted, for example, during the vertical interval of the television signal, is coupled to convolver 10 through switch 18 and line 22 for temporary storage thereby, the stored reference signal including ghost components characterizing the multipath distortion of the channel. Switch 18 otherwise couples the video information on line 20 to difference amplifier 14 through line 16. The output of difference amplifier 14 is then convolved with the stored reference signal to derive the appropriate synthetic ghosts on line 12. The synthetic ghosts developed on line 12 are subtracted from the ghosts in the incoming video information in difference amplifier 14 whose output consequently consists of ghost free video information.

Figure 2:
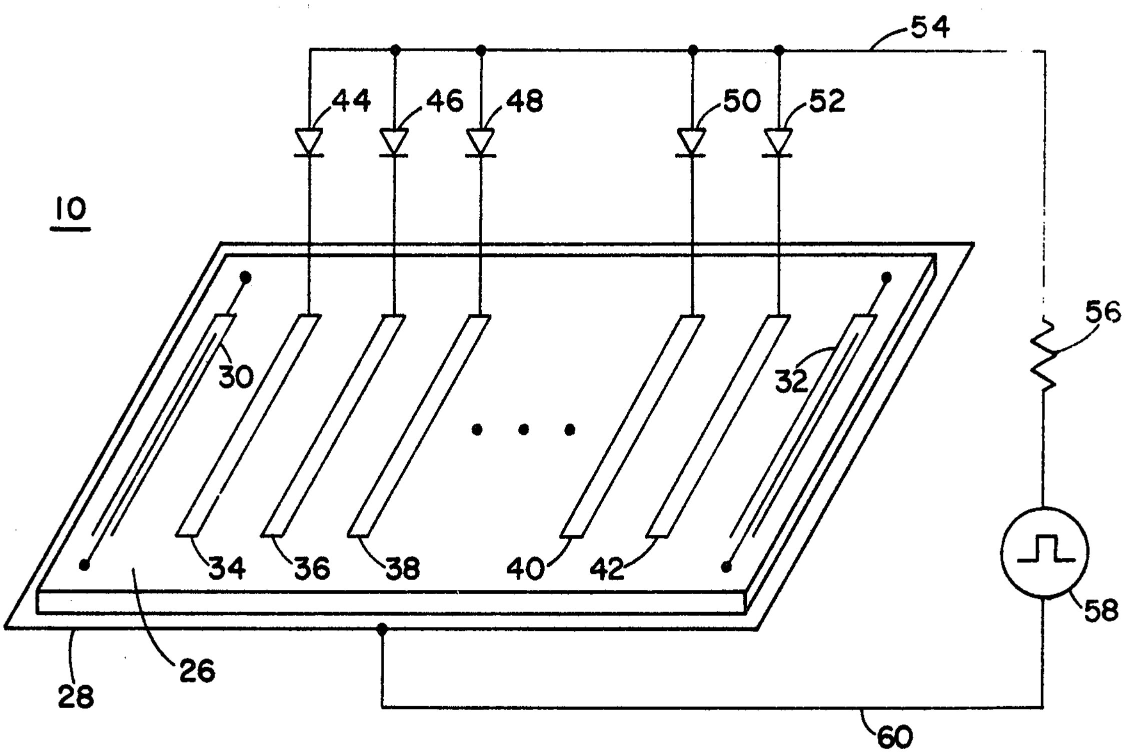
FIG. 2 diagrammatically illustrates a generalized embodiment of a surface wave storage convolver in accordance with the present invention.

While not limited thereto, a convolver useful in a circuit such as shown in FIG. 1 is illustrated in FIG. 2. For purposes of clarity in the following explanation, it will be assumed that the convolver illustrated in FIG. 2 is intended to operate in a ghost cancellation system to convolve reference and video information to obtain synthetic ghosts as described above. However, it will be appreciated that the convolver is adaptable for use in other systems where it is necessary to obtain the convolution or correlation of a pair of signals.

From FIG. 2 it will be observed that convolver 10 of the present invention comprises a surface wave propagating medium 26, e.g., a Lithium Niobate substrate, disposed overlying a metalized groundplane or common electrode 28. In this regard, common electrode 28 could also comprise a strip of material disposed on top of the substrate and formed in a variety of configurations. An input transducer 30 is coupled to the surface of surface wave propagating medium 26 at one end thereof and a similar transducer 32 is coupled to medium 26 at the opposite end thereof. Input transducers 30 and 32 define a surface wave propagation path extending therebetween along the surface of medium 26. With reference to FIG. 1, input transducer 30 corresponds to the input of convolver 10 fed by line 24 whereas input transducer 32 corresponds to the input fed by line 22. Accordingly, the reference signal is applied to convolver 10 by means of input transducer 32 and the video information is applied by means of input transducer 30. It will of course be appreciated that the signals applied to input transducers 30 and 32 will be modulated on an rf carrier having a frequency $f_0$. Frequency $f_0$ is accordingly referred to herein as the operating frequency of the convolver. Also, it will be understood that convolver 10 is adaptable for performing the correlation operation on a pair of input signals by supplying both signals successively to the same one of either input transducer 30 or input transducer 32.

A plurality of signal sampling transducers consisting of electrodes 34, 36, 38, 40 and 42 are coupled to medium 26 along the surface wave propagation path defined by input transducers 30 and 32. Each of the electrodes is also coupled to one of a plurality of signal storage elements 44, 46, 48, 50 and 52 shown in FIG. 2 as discrete varactor-type diodes. The anodes of signal storage elements 44–52 are coupled by an output line 54 to an output impedance 56 and therefrom to a pulse source 58. The circuit is completed by coupling the other terminal of pulse source 58 to common electrode 28 by a line 60.

The convolution operation is executed by convolver 10 by initially applying the modulated reference signal to input transducer 32 wherein it is transduced into an acoustic wave and propagated along medium 26 towards transducer 30. The resulting surface waves, which have an acoustic wavelength $d_0 = v_0/f_0$, where $v_0$ is the characteristic propagation velocity in meters per second (m/sec) of medium 26, are sampled by transducers 34–42 in response to the operation of pulse source 58, the sampled values being transferred to and stored as changes in the capacitance of diodes 44–52. In this regard, pulse source 58 is operable for producing either a D.C. pulse of short duration compared to $1/f_0$ or a frequency burst at $f_0$ but short compared to 1/BW, where BW is the nominal bandwidth of the video signal. Subsequently, the video signal, also modulated on an rf carrier having a frequency $f_0$, is applied to input transducer 30 resulting in the launching of surface waves in the direction of transducer 32. The surface waves launched in response to the modulated video signal interact with the reference signal stored in the diodes to produce a convoluted output on line 54 which is coupled to output impedance 56. With reference to FIG. 1, the convoluted output developed on line 54 corresponds to the synthetic ghosts produced on line 12 and applied to difference amplifier 14 for subtraction from the ghost containing video signal.

Figure 3:
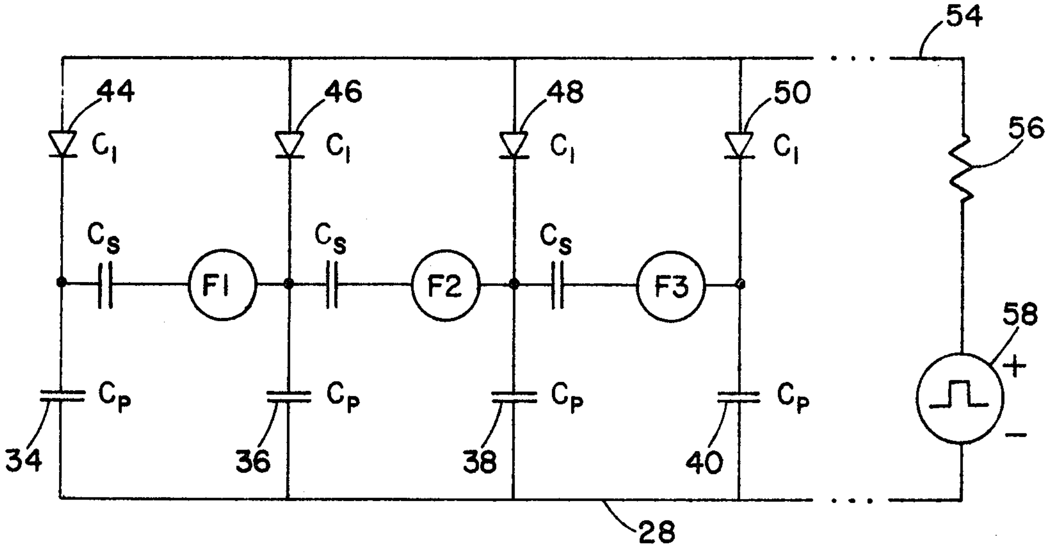
FIG. 3 is an equivalent electrical schematic diagram corresponding to the storage convolver shown in FIG. 2.

The detailed operation of convolver 10 is more conveniently explained with the aid of the equivalent circuit shown in FIG. 3. In this figure, capacitances $C_p$ represent the individual capacitances formed between transducers 34–42 and common electrode 28 while capacitances $C_s$ represent the interelectrode capacitances existing between the sampling transducers. Capacitances $C_t$ represent the reverse biased capacitances of the varactor diodes 44–52. Signal generators $F_1$, $F_2$, and $F_3$ represent the voltages induced between the sampling electrodes in response to the propagation of a surface wave along medium 26.

Shortly after the reference signal is applied to input transducer 32 and during the duration of a read-in pulse, diodes 44–50 are all conducting whereby the voltages at the anodes of the diodes are all substantially equal to the peak value of the read-in pulse. Capacitors $C_p$ consequently charge to this peak value while capacitors $C_s$ charge to values determined by the instaneous values of signal generators $F_1$14 $F_3$. Following the read-in pulse, varactor diodes 44–50 are charged by capacitors $C_p$ and $C_s$. The charges received from capacitors $C_p$ provide a voltage reverse biasing the varactor diodes while the charges received from capacitors $C_s$ modulate the bias voltage thereby modulating the capacitances of the diodes. As a result, the instantaneous acoustic intensities corresponding to the surface waves produced by the reference signal are stored as capacitance variations in the diodes.

It will be observed that the equivalent circuit shown in FIG. 3 comprises a series of bridge circuits each exhibiting or storing an imbalance related to the sampling voltages developed by signal generators $F_1$–$F_3$. The output of a bridge circuit is proportional to the product of its input (generators $F_1$, $F_2$, and $F_3$) and the amount of non-equilabrium characterizing the circuit. Therefore, the voltages produced by signal generators $F_1$–$F_3$ in response to surface waves subsequently launched by input transducer 30 when activated by the modulated video signal will result in an output on line 54 proportional to the product of the reference signal and the video signal. Since the reference signal was entered in the right-hand transducer (transducer 32), propagated to the left along medium 26 and subsequently stored while the video signal was propagated to the right from left-most transducer 30, the output signal on line 54 corresponds to the convolution of the two signals.

Referring back to the convolver shown in FIG. 2, it has been found that by judicial selection of the operating frequency $f_0$ in relation to the center-to-center spacing of sampling transducers 34–42, a faithful representation of a sampled signal can be stored in diodes 44–52 using less than three and, in fact, often less than one diode per acoustic wavelength of the sampled signal. In particular, it has been found that a signal is faithfully reproduced by storage elements 44–52 when the operating frequency $f_0$ and the spatial sampling frequency $f_s$ (the reciprocal of the center-to-center spacings of the sampling transducers) are related by the following expression: $f_s(n + \frac{1}{2}) = 2f_0$, where $n$ is an integer. Selection of the spatial sampling frequency $f_s$ and operating frequency $f_0$ in accordance with this expression results in a sampling arrangement having individual sampling transducers spaced less than one per acoustic wavelength of the propagated signals and provides successvie samples thereof in phase quadrature relationship when $n$ is greater than 1. For $n = 1$, the transducers are spaced by $\frac{3}{4}$ of an acoustic wavelength and for $n = 0$ the spacing is $\frac{1}{4}$ of an acoustic wavelength. In other words, in terms of the acoustic wavelength $d_0$ of a propagated signal, the center-to-center spacing of electrode elements 34–42 comprises an integral number of acoustic wavelengths $d_0$ plus or minus $\frac{1}{4}$ of an acoustic wavelength $d_0$.

Moreover, the phase quadrature spacing of transducer elements 34–42 reduces the susceptibility of convolver 10 to the undesirable accumulation of reflections from the individual transducer elements. Since adjacent ones of the transducers 34–42 are spaced in phase quadrature relationship relative to a signal propagated along medium 26, reflections initiated by any two adjacent transducers will combine 180° out of phase thereby cancelling instead of coherently accumulating. In this manner, the totality of reflections caused by sampling transducers 34–42, which reflections tend to distort the convoluted output developed on line 54, is kept to a minimum.

It has further been found that spurious products resulting from the sampling operation can be significantly reduced by selecting a sampling frequency $f_s$ equal to at least about four times the bandwidth of the baseband signal modulating the rf carrier $f_0$. Considering a video signal having a nominal bandwidth BW modulating an rf carrier of frequency $f_0$, the desired and spurious components of the sampling process fall within well defined frequency bands. The desired band extends from $f_0 -$ BW to $f_0 +$ BW while the spurious components fall in bands extending from $nf_s - (f_0 + BW)$ to $nf_s - (f_0 - BW)$ and from $nf_s + (f_0 + BW)$ to $nf_s + (f_0 - BW)$, where $f_s$ is the spatial sampling frequency and $n$ is an integer. By relating $f_0$ and $f_s$ in accordance with the foregoing expression, i.e., $f_s(n + \frac{1}{2}) = 2f_0$, the desired band is centered between the spurious bands and, by constraining $f_s$ to a value at least equal to about 4BW overlap of the bands is eliminated. Therefore, in a television system having a nominal bandwidth of about 5MHz, the sampling frequency $f_s$ would be at least equal to about 20MHz.

Figure 4:
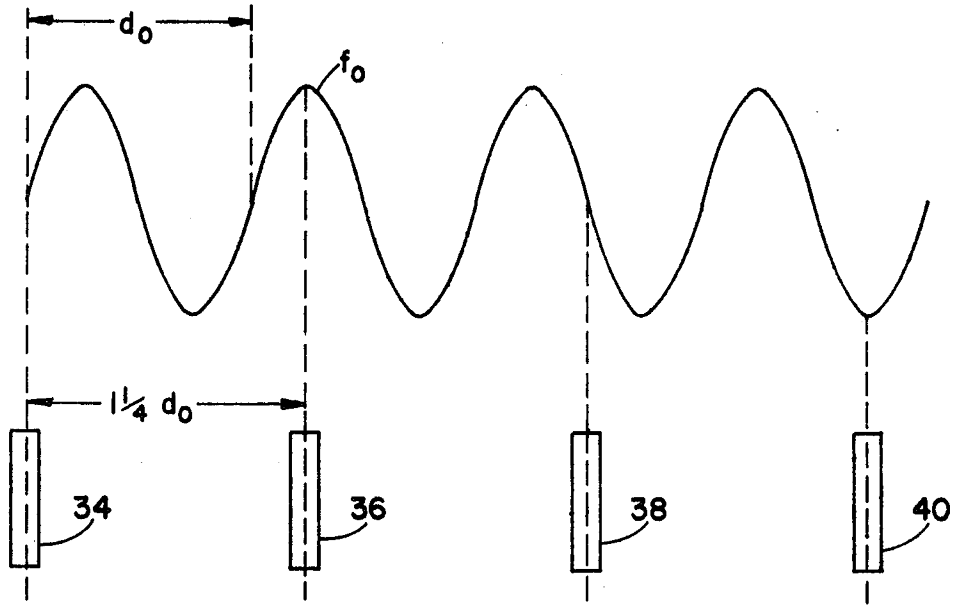
FIG. 4 illustrates one spacing arrangement of sampling transducers useful with a storage convolver as shown in FIG. 2.

FIG. 4 diagrammatically illustrates the case where the spatial sampling frequency $f_s$ is 20 MHz with $n$ equal to 2. Substituting these values into the above expression yields an operating frequency $f_0$ of 25MHz. The sinewave depicted in FIG. 4 therefore represents a traveling wave on medium 26 having a frequency $f_0$ of 25MHz and a corresponding wavelength $d_0$ of $v_0/25$ micrometers. The sampling transducers 34–40 are equally spaced by $1\frac{1}{4}$ $d_0$ or $v_0/20$ micrometers so as to achieve a spatial sampling frequency of 20MHz. It will be appreciated that while the sampling transducers have been diagrammatically represented by narrow strips, in practice they comprise structures selected so as to achieve an optimum response at the operating frequency $f_0$.

Figure 5:
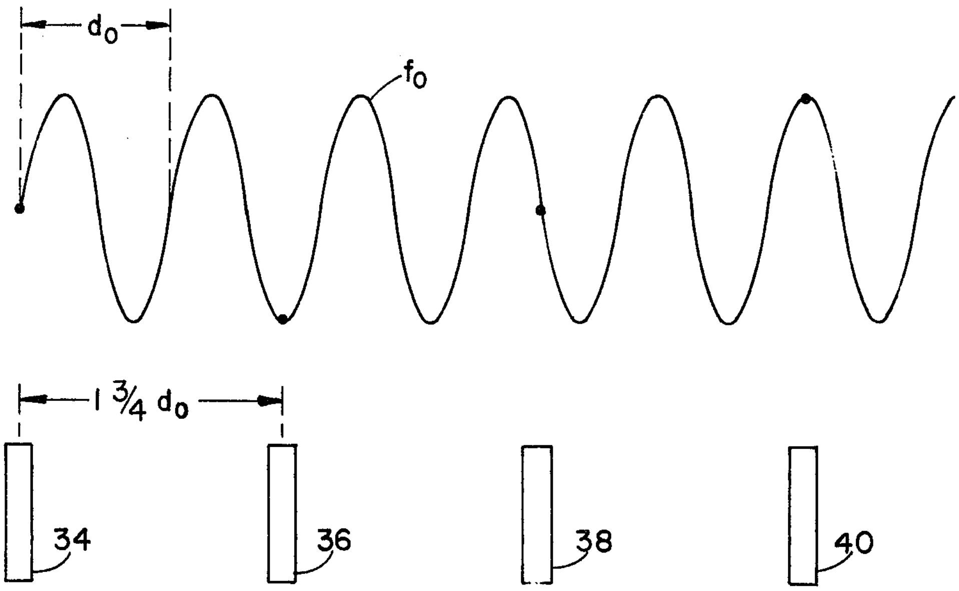
FIG. 5 illustrates another spacing arrangement of sampling transducers useful with a storage convolver as shown in FIG. 2.

FIG. 5 similarly illustrates the condition where the spatial sampling frequency $f_s$ is 20MHz but where $n$ is equal to 3. Here, the operating frequency $f_0$ is calculated to be 35MHz. With this set of parameters the sampling transducers have center-to-center spacings of $1\frac{3}{4}$ of the acoustic wavelength $d_0$. It will be noted that in both cases, i.e., in both FIGS. 4 and 5, the sampling transducers are spaced less than one per acoustic wavelength $d_0$ and provide successive samples in phase quadrature relationship.

Figure 6:
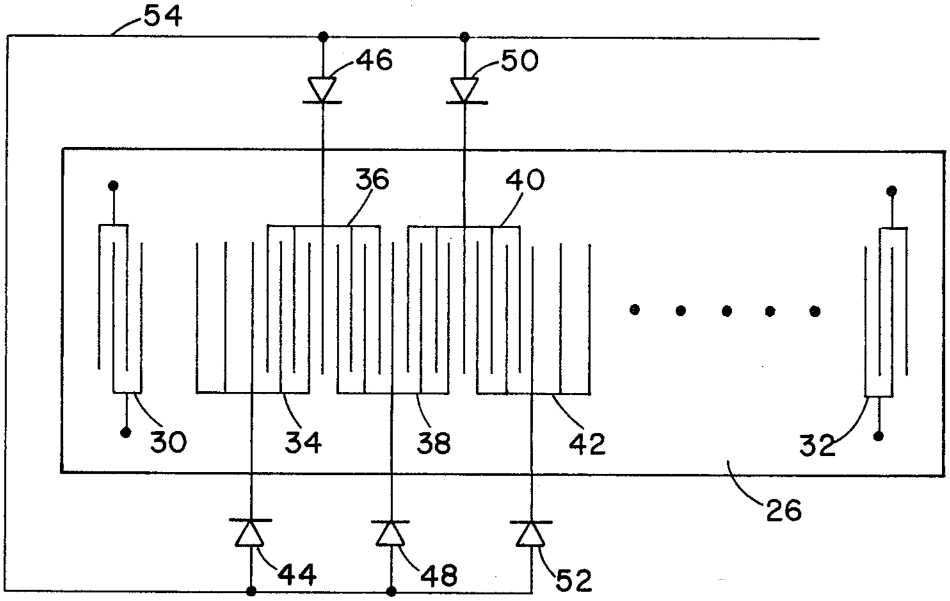
FIG. 6 illustrates a preferred embodiment of sampling transducers.

The single electrode sampling transducers heretofore discussed are relatively inefficient sampling structures. A preferred and significantly more efficient electrode sampling arrangement is shown in FIG. 6. In this structure the spatial sampling frequency $f_s$ is again equal to 20MHz and $n$ is selected to equal 4. Therefore, the operating frequency $f_0$ becomes 45MHz and the center-to-center spacing of the transducers is $2\frac{1}{4}$ $d_0$, where $d_0 = v_0/f_0$. The sampling electrodes 34–42 comprise five finger comb-type structures uniformly interdigitated with one another. These transducers have a center frequency of or an optimum response at 50MHz which is relatively close to the operating frequency of 45MHz and therefore provide a nearly optimized selection. This structure is relatively invulnerable to bulk waves and provides a reasonable output power level.

The efficiency of convolver 10 is further optimized through an informed selection of component values. For example, it may be shown that optimum power is obtained from the convolver when the capacitance values illustrated in FIG. 3 are scaled such that $C_1 = C_p = 1/3\ C_s$. The use of discrete diodes which may be individually preselected and matched to satisfy the foregoing relationship significantly facilitates such optimization.

A wide variety of convolver arrangements are conceivable in accordance with the foregoing teachings by suitably selecting system design parameters from among such variables as $f_s$, $n$, sampling transducer structure, etc. Although a great deal of flexibility exists in tailoring a convolver using these design parameters, it will be obvious that they also introduce some design constraints which must be dealt with. For instance, a convolver fabricated on the basis of $n = 0$ or $n = 1$ will have a relatively low operating frequency $f_0$ which may not be acceptable in certain applications. Similarly, while a spatial sampling frequency $f_s$ of about 20MHz is appropriate for 5MHz bandwidth video applications, it may not provide for adequate system performance in another application.

While particular embodiments of the present invention have been shown and described, it will be apparent that changes and modifications may be made therein without departing from the invention in its broader aspects. The aim of the appended claims, therefore, is to cover all such changes and modifications as fall within the true spirit and scope of the invention. What is claimed is:

1. In an acoustic wave storage system of the type having means comprising a plurality of signal sampling elements disposed in association with the surface of an acoustic wave propagating medium for sampling surface waves propagated along said surface having an acoustic wavelength $d_0$ and having means for storing the values of said sampled surface waves for subsequent processing, the improvements wherein said elements are spaced for sampling said surface waves at successive points along said surface separated by substantially $(n/2 + \frac{1}{4})\ d_0$, where $n$ is an integer.

2. The improvement according to claim 1 including input transducer means coupled to said surface and responsive to input signals applied thereto for launching said surface waves, said input signals comprising an rf carrier modulated by a baseband signal having a nominal bandwidth, said element spacing defining a spatial sampling frequency $f_s$ selected such that $f_s$ is greater than or equal to about four times said nominal bandwidth and said acoustic wavelength $d_0$ being selected such that $d_0 = v_0/f_s(n/2 + \frac{1}{4})$, where $n$ is an integer and $v_0$ is the characteristic propagation velocity of said medium.

3. The improvement according to claim 2 wherein said signal sampling elements comprise a plurality of interdigitated comb-type electro-acoustic transducers coupled to said medium, each of said transducers having a series of uniformly interdigitated fingers extending transversely of the direction of wave propagation along said surface.

4. The improvement according to claim 2 wherein said sampling frequency $f_s$ and the frequency of said rf carrier comprise respectively 20MHz and 45MHz and wherein each of said transducers comprises a five finger structure having an optimum response to acoustic waves propagated along said medium at a frequency of 50MHz.

5. An acoustic wave storage convolver comprising:
- a surface-wave propagating medium;
- first and second input transducers coupled to one surface of said medium for launching surface waves in opposite directions along a path therebetween in response to the application of, respectively, first and second path signals, said surface waves having an acoustic wavelength of $d_0$;
- a plurality of cells each comprising a transducer and storage means responsive thereto, said transducers being coupled to said one surface along said path and spaced by at least $\frac{3}{4}$ of said acoustic wavelength $d_0$ for providing successsive samples of said surface waves in phase quadrature relationship;
- means coupled to said cells operable for simultaneously causing said storage means to store the outputs of said transducers in response to surface waves launched by one of said input transducers; and
- output means for convolutely combining said stored outputs with the outputs developed by said transducers in response to surface waves launched by the other of said input transducers.

6. The acoustic wave storage convolver according to claim 5 including an electrode disposed adjacent the other surface of said medium and forming with said transducers a plurality of capacitors $C_p$ each coupled to a respective one of said storage means.

7. The acoustic wave storage convolver according to claim 6 wherein each of said storage means comprises a storage diode having a reverse bias capacitance of $C_1$ and wherein the interelectrode capacitance of adjacent ones of said transducers is represented by $C_s$, components being selected such that $C_p = C_1 = C_s/3$.

8. The acoustic wave storage convolver according to claim 5 wherein said first and second input signals each comprise an rf carrier modulated by a baseband signal having a nominal bandwidth and wherein said transducer spacing defines a spatial sampling frequency $f_s$, said sampling frequency being selected such that $f_s$ is greater than or equal to about four times said nominal bandwidth.

9. The acoustic wave storage convolver according to claim 8 wherein said transducers comprise a plurality of comb-type interdigitated electro-acoustic transducers coupled to said medium, each of said transducers having a series of uniformly interdigitated fingers extending transversely of the direction of wave propagation along said surface.

10. The acoustic wave storage convolver according to claim 9 wherein said sampling frequency $f_s$ and the frequency of said rf carrier comprise respectively 20MHz and 45MHz and wherein each of said transducers comprises a five finger structure having the optimum response to acoustic waves propagated along said medium at a frequency of 50MHz.

* * * * *